United States Patent [19]

Reddy

[11] Patent Number: 5,032,808
[45] Date of Patent: Jul. 16, 1991

[54] R.F. CHOKE FOR CATV SYSTEM

[76] Inventor: Prabhakara Reddy, 302 Mott Rd., Fayetteville, N.Y. 13066

[21] Appl. No.: 382,402

[22] Filed: Jul. 21, 1989

[51] Int. Cl.$^5$ .................................................. H03H 7/09
[52] U.S. Cl. ...................................... 333/181; 333/185; 333/245; 336/180; 336/170; 336/172
[58] Field of Search ................ 333/245, 175, 181, 185, 333/131, 132; 336/180, 183, 170, 172, 147, 69

[56] References Cited

U.S. PATENT DOCUMENTS

| | | | |
|---|---|---|---|
| 2,401,882 | 6/1946 | Polydoroff | 336/180 X |
| 2,692,372 | 10/1954 | Goldstine | 333/181 |
| 3,590,329 | 6/1971 | Krepps, Jr. | 336/183 X |
| 3,982,814 | 9/1976 | Kaiserswerth et al. | 336/180 X |
| 4,394,631 | 7/1983 | Pavlic | 333/175 X |
| 4,425,565 | 1/1984 | Johns | 333/175 X |
| 4,641,115 | 2/1987 | Bailey | 333/245 X |

Primary Examiner—Eugene R. LaRoche
Assistant Examiner—Benny Lee
Attorney, Agent, or Firm—Wall and Roehrig

[57] ABSTRACT

A radio frequency choke for a cable or CATV system is designed for blocking signals from 5 to 1000 MHz and passing 60 Hz AC power. The RF choke has a wire coil that is wound upon a coil form of a predetermined cross section, the coil being formed of a number of successive spaced windings on the form, with each winding being joined to the next by an air coil of at least one turn, formed off the loop. The various successive windings should have different numbers of turns. Forming the air coils tends to tighten the windings onto the form, so that a fixative coating or adhesive can be eliminated or omitted.

19 Claims, 3 Drawing Sheets

R.F. CHOKE FOR CATV SYSTEM

BACKGROUND OF THE INVENTION

This invention is directed to a radio frequency (RF) choke, and more specifically concerns a choke for separating an AC power wave from a broadband signal, where both are carried on the same conductors.

It is common in CATV distribution systems to use a broadband signal (e.g. 50 to 1000 MHz) to carry the various channels and other information to the subscribers and another broadband signal (e.g. 5 to 30 MHz) to carry information from the subscribers to the cable distribution station, and 60 Hz single phase power to operate amplifiers and other devices located at various points on the cable system. These three waves are all carried on the same conductors, e.g., the center conductor and braid of a coaxial cable.

It is a common practice to use an RF choke to separate the single-phase AC power from the broadband RF signals at points along the cable where the RF signal is to be processed in an RF device. After the device, the AC power is recombined with the broadband signal, and an RF choke is also employed at this position.

The AC power has a current magnitude of 12 to 15 amperes at 60 volts. On the other hand, the broadband RF signal has a low peak voltage, e.g. 0.3 volts. These chokes serve to isolate the RF device from the AC power. However, in doing so the chokes should not permit any significant amount of the RF broadband signal to pass through the choke on the AC power path, as a significant signal loss will occur.

A commercial RF choke is typically constituted by a number of turns of magnet wire wound upon a ferrite coil form. A resistor can be connected in parallel wit a portion of this coil, e.g., from a preselected turn to one of the lead wires, to serve as a shunt. This parallel resistance reduces the impedance of the RF choke. There is an effective capacitance between turns of the wire coil, which produces a self-capacitance that combines with the coil inductance to produce an LC resonance. Typically, such resonances unfortunately often lie within the band of the broadband RF signal. The effect of the shunt resistance is to reduce the Q of the LC resonance, thereby blunting the sharpness of any in-band resonances.

Reduction in the number of turns of the choke can push any LC resonances above the passband, but this reduction will also result in a reduction in inductance, limiting the suitability of the choke at the 5 MHz low end of the band.

The presence of the shunt resistor in the above-described choke also reduces the signal impedance to ground, thereby increasing the signal loss.

One attempt to remedy the above problems is described in U.S. Pat. No. 4,394,631 to Pavlic. In that approach, an RF "resistor" is formed of a bead of ferrite disposed over the wire at a predetermined turn on the coil, and a second resistor is connected in parallel to a portion of the coil between a preselected turn and a lead wire. The effect of the series "resistor" is to push the choke LC resonance up above the pass band. However, for a number of reasons, the pass band is limited to a maximum of 400 to 500 MHz.

The heavy current (12 to 15 A) through the choke has a tendency to saturate the magnetic material of the bead, so that its effectiveness on the RF signal is reduced. Also, no effort is made to reduce the cumulative capacitance between turns. In fact, a glue or cement used to hold the coil onto the form actually serves as a dielectric, thus increasing the self-capacitance and further emphasizing any LC resonances. Consequently, it has been impossible to eliminate resonance in the range between about 500 MHz and 1000 MHz.

However, this is a significant band of frequencies, as TV cable systems must be able to carry RF signals in the entire range between 5 MHz and 1000 MHz.

OBJECTS AND SUMMARY OF THE INVENTION

It is an object of this invention to provide an RF choke that can split signal and power in a television cable system, and which avoids the drawbacks of the prior art.

It is another object of the invention to provide an RF choke which avoids undesirable resonance in the RF band up to 1000 MHz.

It is still a further object of this invention to provide an RF choke that avoids ferromagnetic saturation in the presence of currents exceeding twelve amperes.

It is yet a further object of the invention to provide an RF choke that avoids the need for glue, shellac, or other fixatives to hold its winding onto its coil form.

In accordance with an embodiment of the invention, a radio frequency choke is wound on a coil form of a predetermined cross section as a plurality of windings, each winding having a respective number of turns. A first lead is connected to one side of a first winding of $N_1$ turns. The last turn of the first winding is connected through a small inductor, in this case an air coil, formed as a loop of at least one turn off the coil form, to a first turn of a second winding of $N_2$ turns. The air coil permits a space to be included on the coil form between the final turn of the first winding and the first turn of the second windings. Then another small inductor connects the last turn of the second windings to a first turn of a third windings of $N_3$ turns, and so forth. Another lead extends from the last turn of the last winding. There are at least two windings joined by at least one air coil, and up to as many as desired for a particular application. In a preferred embodiment there are three windings, of respective different numbers of turns, with successive windings being joined by single-turn air coils.

In a preferred mode, a resistor is connected in parallel with one of the windings, preferably from a center of the air coil to an end lead.

The air coil is twisted to tighten the winding on the coil form, so that a fixative medium, such as a shellac or a glue, is not needed. This minimizes the amount of dielectric between turns, and thereby reduces self-capacitance, and thereby increases the frequency of any resonance, so as to push up the useful bandwidth of the choke. The presence of the resistor will reduce the "Q", or sharpness, of any resonances within the RF band of interest.

The above and many other objects, features, and advantages of this invention will be more fully appreciated from the ensuing description of a preferred embodiment, when read in connection with the accompanying Drawing.

DETAILED DESCRIPTION OF A PREFERRED EMBODIMENT

Figure 1:
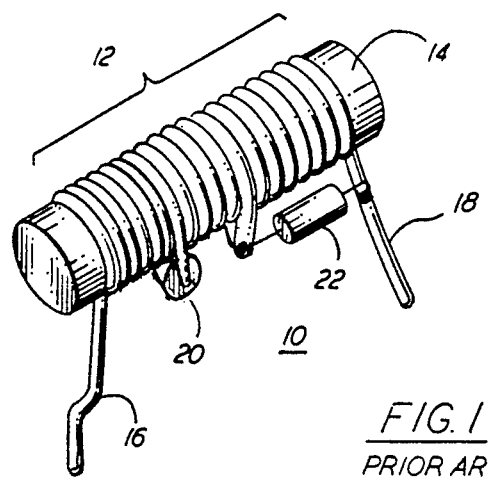
FIG. 1 is a perspective view of a radio frequency choke of the prior art.

With reference to the Drawing, and initially to FIG. 1, a prior-art choke coil 10 will be discussed for the purposes of emphasizing the important inventive features of this invention. This choke coil 10 is of the type described in U.S. Pat. No. 4,394,631. The choke coil has a winding 12 of about twenty-one turns on a ferrite core 14. An input lead 16 and an output lead 18 extend from ends of the winding 12. A small ferrite donut 20 is slipped on to the winding 12 at the seventh turn from the input lead 16. This ferrite is intended to serve as an RF "resistance", but has no effect on direct current or on the 60 Hz power component. A resistor 22 is provided as a resonance damping element and is connected in parallel with a portion of the winding 12 between the fourteenth turn and the output lead 18. The RF choke 10 has an effective band up to about 600 MHz. Because of self-capacitance, and because of the dielectric effect of the shellac or other substance used to hold the winding 12 onto the core 14, it is not possible to increase the lowest resonance frequency above that level. Consequently, this type of choke coil can lead to problems if used in connection with a cable or CATV system in which frequencies up to 1000 MHz are employed.

Figure 2:
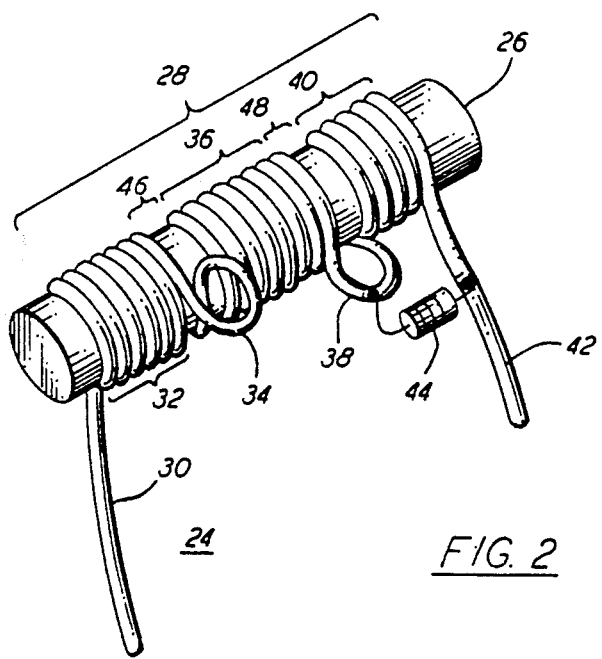
FIG. 2 is a perspective view of a radio frequency choke according to an embodiment of the present invention.
Figure 3:
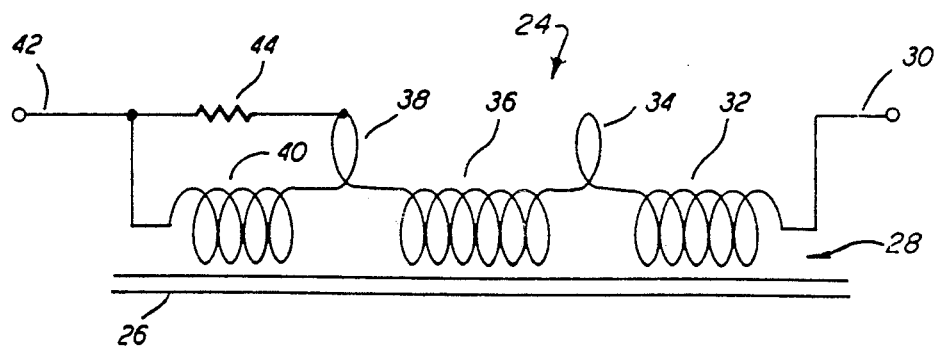
FIG. 3 is a schematic diagram of the choke of FIG. 2.

An improved choke coil 24 according to the present invention is shown with reference to FIGS. 2 and 3. This choke coil 24 has a core 26 of a predetermined cross section and which can be ferrite or can contain powdered iron. On this core 26 is wound a coil 28 extending from an input lead 30. The coil 28 is formed of a single wire, but the coil 28 is divided. In this embodiment the coil consists of a first winding 32 of five turns, connected to a single-loop air coil 34 which is wound off the core, a second winding 36 consisting of seven turns connected to a single, loop air coil 38 also wound off the core 26, and a third winding 40 that consists of four turns, to which is connected an output lead 42. A resonance-damping resistor 44, here having a value of 750 ohms, is connected in parallel with the third winding 40, and soldered to a midpoint of the air coil loop 38 and to the output lead 42. The use of the air coils 34 and 38 creates spacings 46 and 48 on the core 26, respectively between the windings 32 and 36 and between the windings 36 and 40. These spacings 46, 48 help reduce the total self-capacitance of the choke 24. Also, the fact that the individual windings 32, 36, and 40 consist of respective different numbers of turns means that each of the windings has a different resonance frequency and the three resonances will be widely separated. Moreover, the twisting of loops for the air coils 34 and 38 tightens the wire in the windings 32, 36, and 40, so that the coil 8 is held tightly against the core 26 without need for any adhesive. This means that adhesive, shellac, or other adherent, which may have a significant dielectric constant, is omitted. This reduces the choke self-capacitance.

Figure 4:
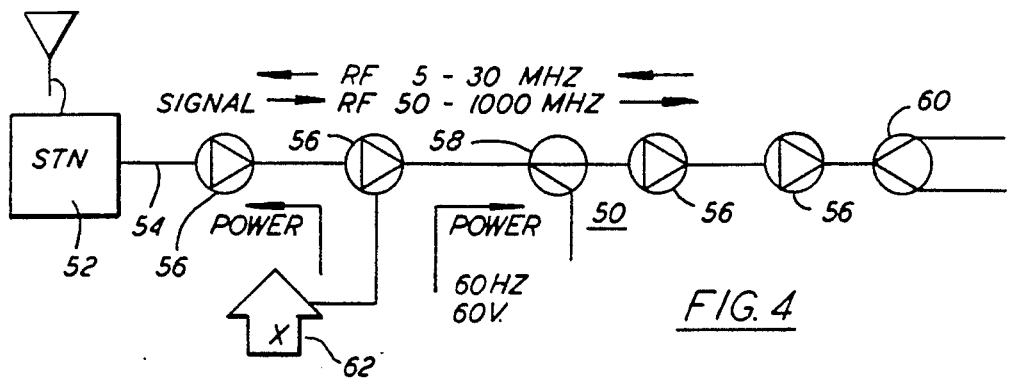
FIG. 4 is a partial system schematic of a cable TV system in which choke coils of the present invention can be favorably employed.

The RF choke 24 of this invention is favorably employed in a Cable TV System 50 of the type shown in simple schematic form in FIG. 4. The cable system 50, in simplest terms, has a cable station 52 with coaxial cable 54 that extends out therefrom. A number of in-line devices, such as amplifiers 56, a coupler 58, and a splitter 60 are typically employed at various positions along the cable 54. A subscriber 62 can be connected anywhere along the cable system. Typically, TV cable channels and other information are carried in a signal band of 50 to 1000 MHz from the station 52. Information from the subscribers is carried to the station along the cable in a band of about 5 to 30 MHz. Power for energizing the various devices e.g. amplifiers 56, can be supplied at various places along the cable 54 to travel in either direction. This power is typically square-wave 60 Hz power supplied at nominal 60 volts. The cable 54 typically carries twelve to fifteen amperes of current at 60 Hz.

Figure 5:
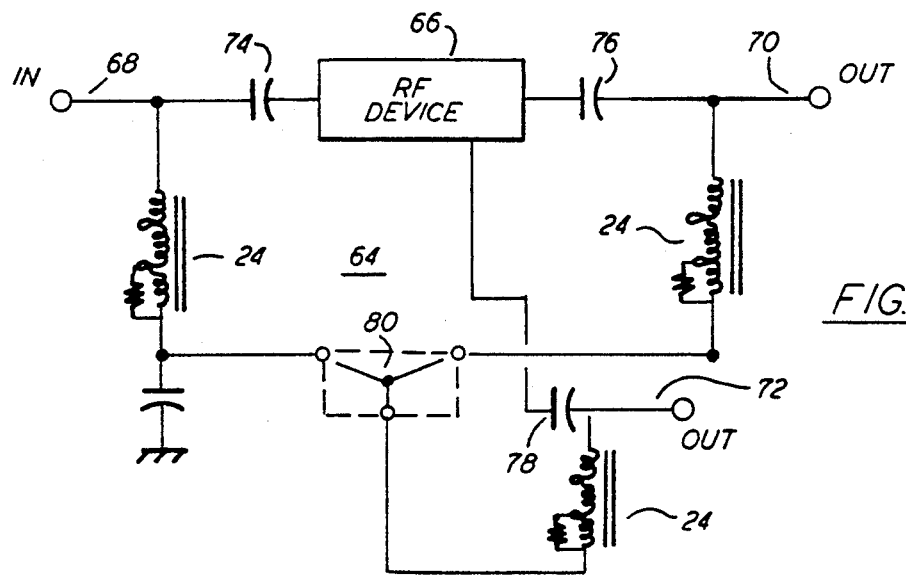
FIG. 5 is an electrical schematic of a portion of a Cable TV System showing an RF device in combination with choke coils of the present invention.
Figure 6:
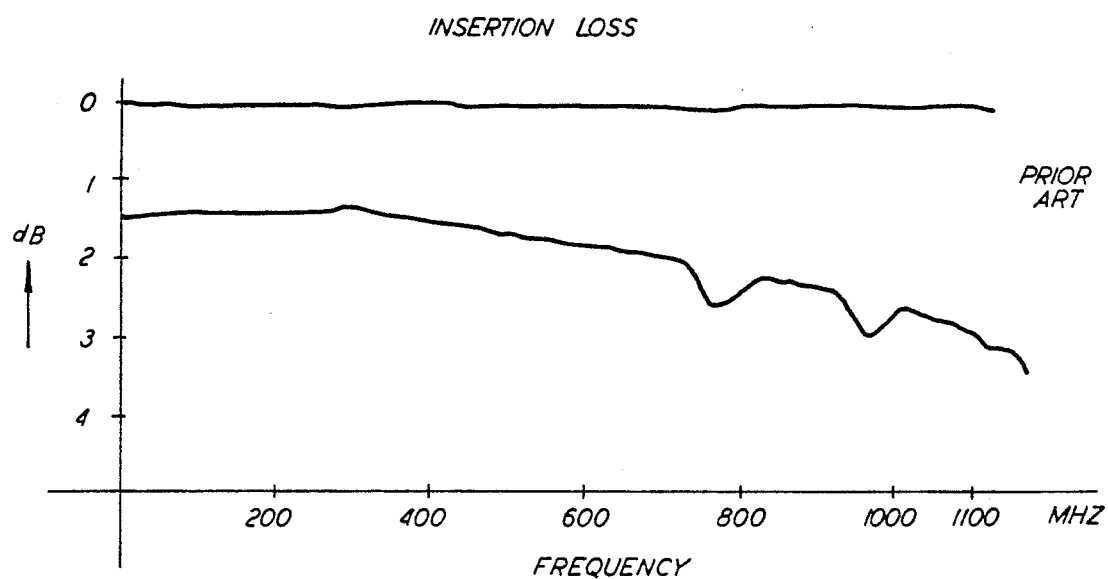
FIG. 6 is a chart showing insertion loss of an 8 db directional coupler in a Cable TV System employing RF chokes of the prior art.
Figure 7:
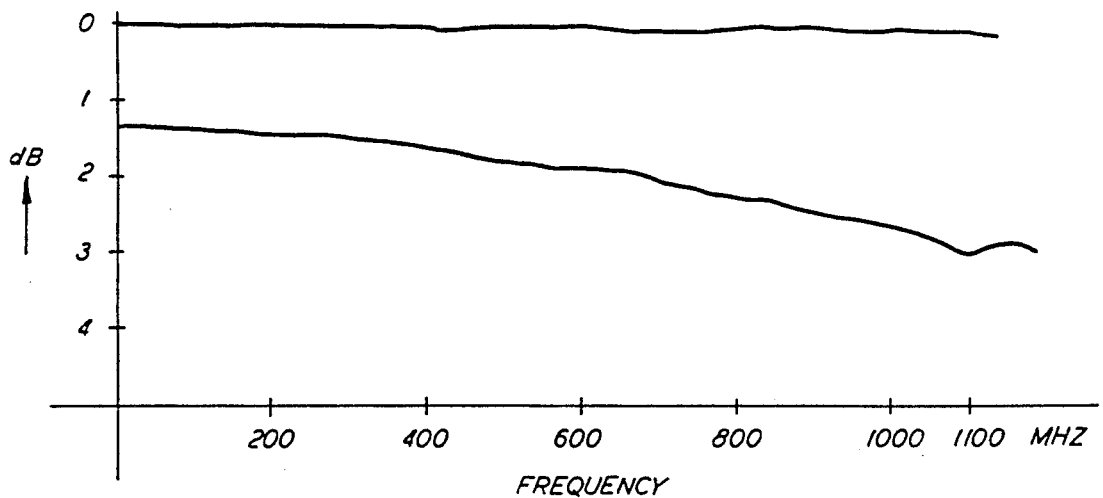
FIG. 7 is a chart showing insertion loss of the same 8 db directional coupler in a Cable TV System employing RF chokes according to an embodiment of the present invention.

In FIG. 5, a typical RF circuit 64 is shown of the type connected in-line, such as the amplifiers 56, coupler 58, and splitter 60 of FIG. 4. This circuit 64 can include an RF device 66 having an input terminal 68 and one or more output terminals 70, 72. Isolation capacitors 74, 76, 78 are connected to the RF device 66 in a radio frequency path, these isolation capacitors having a value so as to exclude the 60 Hz power wave. A suitable number of RF chokes 24 are connected between the input terminal 68, and output terminal 70, 72 and a jumper device 80 for bridging the AC power to and/or from the various input and output terminals. The role of these chokes 24 is to bypass the twelve to fifteen ampere power wave around the RF device 66, but also to block passage of as much of the 5 MHz-1000 MHz signal as is possible, so as to minimize the cumulative insertion loss across the entire cable 54 from the cable station to the subscribers. The small capacitor (unnumbered) in FIG. 5 simply provides an RF ground for the power wave. This is a convention feature on equipment of this type. As each RF circuit 64 includes two or more of these chokes, the choke should avoid any resonances within the signal band, because the losses will accumulate rapidly along the cable. The performance of the chokes 24 of this invention and the chokes 10 of the prior art can be easily compared with reference to FIGS. 6 and 7. FIG. 6 is a typical chart of insertion loss verses frequency for an 8 dB directional coupler, where the 60 Hz power is bypassed through the RF choke 10 of the prior art. This chart clearly shows resonances at about 800 MHz and about 950 MHz. FIG. 7 is a chart of insertion loss verses frequency for a similar directional coupler, but where the 60 Hz power was bypassed through the RF choke 24 embodying this invention. There are no significant resonances anywhere in the band up to and beyond 1000 MHz.

Figure 8:
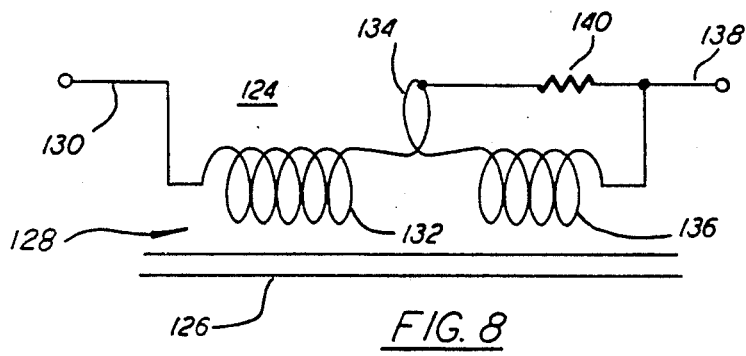
FIGS. 8 and 9 are schematic diagrams of RF chokes according to alternative embodiments of the present invention.

Under the high-current conditions typical in this system, namely when the current is twelve amperes or more, the ferrite core for the choke coil can become saturated thus degrading its effectiveness as an inductance. For that reason, it may be desirable to employ powdered iron or another ferromagnetic substance that is less susceptible to becoming saturated under these conditions. Alternative embodiments of this invention are shown schematically in FIG. 8 and 9. In the alternative embodiment of FIG. 8, a choke 124 has a core 126 and a coil 128 formed of two windings of different numbers of turns. The coil 128 is formed of an input lead 130, a first winding 132, a single loop air coil 134, a second winding 136 and an output lead 138. If desired, a resistor 140 can be connected in parallel to the winding 136.

Figure 9:
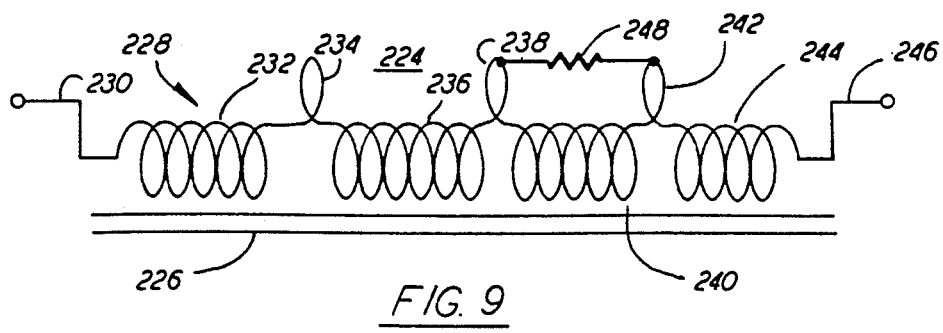

In the embodiment of FIG. 9, a choke 224 is formed of a core 226 and a coil 228 that is formed of a larger number of windings. Here the coil 228 consists of an input lead 230, a first winding 232, an air coil loop 234, a second winding 236, a second air coil 238, a third winding 240, a third air coil 242, a fourth winding 244, and an output lead 246. A resistor 248 can also be connected in parallel with one of the windings, and in this embodiment it is connected in parallel with the winding 240. Of course, many other choke coil embodiments are possible which would follow the same principles as outlined above.

Instead of a ferrite core, the choke can employ a tubular sleeve with a tuning slug, or the choke can be formed as an air coil, removing the coil form after the wire has been wound.

While the invention has been described in detail with reference to a preferred embodiment and selected variations thereof, it should be apparent to those skilled in the art that many modifications and variations are possible without departure from the scope and spirit of this invention as defined in the appended claims.

What is claimed is:

1. An RF choke that comprises a coil form of a predetermined cross section, a wire coil wound upon said coil form, said coil including a first lead, a second lead, at least two successive windings in series with one another and disposed in series between said first and second leads, each of said windings being wound upon said coil form with a spacing between a last turn of one winding and a first turn of a next adjacent winding, and a loop formed off the coil form connected in series between said two windings to join said last turn of the one winding and said first turn of the next winding.

2. An RF choke according to claim 1 further comprising a resistor connected in parallel with one of said windings.

3. An RF choke according to claim 1 wherein said windings are each formed of respective different numbers of turns.

4. An RF choke according to claim 1 wherein said coil form includes a core of ferromagnetic material.

5. An RF choke according to claim 4 wherein said ferromagnetic material includes iron powder.

6. An RF choke according to claim 1 wherein said at least two successive windings are wound in the same helical direction.

7. An RF choke that comprises a coil form of a predetermined cross section; a wire coil wound upon the coil form, said coil including a first lead, a first winding of $N_1$ turns, said first lead being connected to an input side of the first winding, a second winding of $N_2$ turns, a third winding of $N_3$ turns, a second lead connected to an output side of said third winding, said first, second and third windings being wound upon said coil form, a first supplementary coil being formed of at least one turn formed off said coil form joining the first and second windings to leave a space on the coil form therebetween, and a second supplementary coil of at least one turn formed off said coil form joining the second and third windings to leave a space on the coil form therebetween.

8. The RF choke of claim 7 wherein said first and second supplementary coils each form a loop that does not contain the coil form.

9. The RF choke of claim 7 wherein said first, second, and third windings all have different numbers of turns.

10. The RF choke of claim 9, wherein $N_1=5$ turns, $N_2=7$ turns, and $N_3=4$ turns.

11. The RF choke of claim 7 wherein said coil form includes a ferromagnetic core.

12. The RF choke of claim 7 further comprising a resistor connected in parallel with said third winding.

13. The RF choke of claim 12 wherein said resistor is on the order of 750 ohms.

14. The RF choke of claim 7 wherein said coil includes at least a fourth winding on said coil form in series with said first, second, and third windings and between said third winding and said second lead.

15. The RF choke of claim 7 wherein said coil form includes a powdered iron core.

16. An RF choke that comprises a helically wound wire coil including a first lead, a second lad, at least two windings in series with one another and disposed between said first and second leads, each of said windings being wound in a common helix but with a spacing between a last turn of one winding and a first turn of a next adjacent winding, which first turn is the next turn in succession in said common helix, and a loop formed off said helix joining said last turn of said one winding and said first turn of the next winding.

17. An RF choke that comprises at least first and second wire coils wound on a common core with a last turn of the first coil being spaced from a first turn of the second coil, and an inductor formed of a wire loop off said core disposed in series between the first and second coils and joining the last turn of the first coil to the first turn of the second coil.

18. The RF choke of claim 17 that also comprises a third wire coil wound on the common core and another inductor formed of a wire loop off said core joining a last turn of the second wire coil with a first turn of the third coil.

19. The RF choke of claim 17 wherein said wire loop is disposed adjacent a space formed between the last turn of the first coil and the first turn of the second coil and at an axial position of said space.

* * * * *